United States Patent
Chun et al.

(10) Patent No.: US 7,595,118 B2
(45) Date of Patent: Sep. 29, 2009

(54) ORGANIC LIGHT EMITTING DEVICE

(75) Inventors: Min-Seung Chun, Suwon-si (KR);
Jun-Yeob Lee, Suwon-si (KR);
Yong-Joong Choi, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 726 days.

(21) Appl. No.: 11/280,292

(22) Filed: Nov. 17, 2005

(65) Prior Publication Data

US 2006/0115677 A1 Jun. 1, 2006

(30) Foreign Application Priority Data

Nov. 27, 2004 (KR) .................... 10-2004-0098371

(51) Int. Cl.
*H01L 51/54* (2006.01)
(52) U.S. Cl. .............. 428/690; 428/917; 313/504; 313/506
(58) Field of Classification Search .............. None
See application file for complete search history.

(56) References Cited

U.S. PATENT DOCUMENTS

| 6,211,369 | B1 * | 4/2001 | Salbeck et al. ............. 546/18 |
| 6,821,645 | B2 * | 11/2004 | Igarashi et al. ............. 428/690 |
| 2002/0074935 | A1 * | 6/2002 | Kwong et al. ............. 313/504 |
| 2005/0064233 | A1 * | 3/2005 | Matsuura et al. ............. 428/690 |
| 2006/0008672 | A1 * | 1/2006 | Jarikov ............. 428/690 |
| 2006/0257684 | A1 * | 11/2006 | Arakane et al. ............. 428/690 |
| 2007/0099024 | A1 * | 5/2007 | Nii et al. ............. 428/690 |

FOREIGN PATENT DOCUMENTS

| CN | 1492724 | 4/2004 |
| JP | 2002-313583 | 10/2002 |
| JP | 2004-210785 | 7/2004 |
| JP | 2004-253315 | 9/2004 |
| WO | WO 2002/088274 A1 * | 11/2002 |
| WO | WO 03/033617 | 4/2003 |
| WO | WO 2004/018588 | 3/2004 |

OTHER PUBLICATIONS

*Office action* from the Japanese Patent Office issued in Applicant's corresponding Japanese Patent Application No. 2005-188967 dated Jun. 24, 2008.
Chinese Office Action from Chinese Patent Office issued on Applicant's Corresponding Chinese Patent Application No. 200510121585.3 dated Oct. 31, 2008.

* cited by examiner

*Primary Examiner*—Dawn Garrett
(74) *Attorney, Agent, or Firm*—Robert E. Bushnell, Esq.

(57) ABSTRACT

An organic light emitting device including a first electrode, a second electrode, and an emission layer arranged between the first electrode and the second electrode, the emission layer comprising at least two electron transport materials adapted to serve as a host and a phosphorescent dopant. The use of at least two electron transport materials as a host facilitates the re-combination of holes and electrons in neighboring organic layers, thus improving the luminous efficiency and the lifetime of the organic light emitting device.

19 Claims, 2 Drawing Sheets

ORGANIC LIGHT EMITTING DEVICE

CLAIM OF PRIORITY

This application makes reference to, incorporates the same herein, and claims all benefits accruing under 35 U.S.C. §119 from an application for ORGANIC ELECTROLUMINESCENCE DISPLAY earlier filed in the Korean Intellectual Property Office on 27 Nov. 2004 and there duly assigned Serial No. 10-2004-0098371.

BACKGROUND OF THE INVENTION

1. Field of the Invention

The present invention relates to an organic light emitting device, and more particularly, to an organic light emitting device that includes an emission layer made of a phosphorescent dopant having a long lifetime and having excellent luminous efficiency.

2. Description of the Related Art

Emission materials used to form organic light emitting devices are divided into fluorescent materials using singlet excitons and phosphorescent materials using triplet excitons. Phosphorescent materials are organic metal compounds having heavy atoms. In phosphorescent materials, the relaxation of triplet excitons, which is a forbidden transition, occurs thus emitting light. In fluorescent materials, the singlet excitons having a generation probability of 25% are used. Accordingly, phosphorescent materials using triplet excitons having a generation probability of 75% have a better luminous efficiency than fluorescent materials.

An emission layer made of a phosphorescent material includes a host and a dopant. The dopant receives energy from the host, thus emitting light. Such dopants have been continually developed. For example, Princeton University and South California University have developed materials using an Ir metal compound.

Recently, an emission layer made of a carbazol compound as a host has been developed. The carbazol compound has a triplet-state energy band gap as compared to 4,4'-biscarbazolylbiphenyl (CBP). However, when known carbozol compounds are used to form phosphorescent devices, the efficiency and lifetime of the devices are far below a desirable level. Therefore, what is needed is an improved phosphorescent emission layer that has good luminous efficiency and long lifetime.

SUMMARY OF THE INVENTION

It is therefore an object of the present invention to provide an improved organic light-emitting device.

It is also an object of the present invention to provide an organic light-emitting device with excellent luminous efficiency and a long lifetime.

These and other objects can be achieved by a phosphorescent organic light-emitting device where the emission layer is made up of two different electron transport materials that serve as the host for a phosphorescent dopant. According to an aspect of the present invention, there is provided an organic light-emitting device including a first electrode, a second electrode, and an emission layer arranged between the first electrode and the second electrode, the emission layer including at least two electron transport materials adapted to serve as a host and a phosphorescent dopant.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
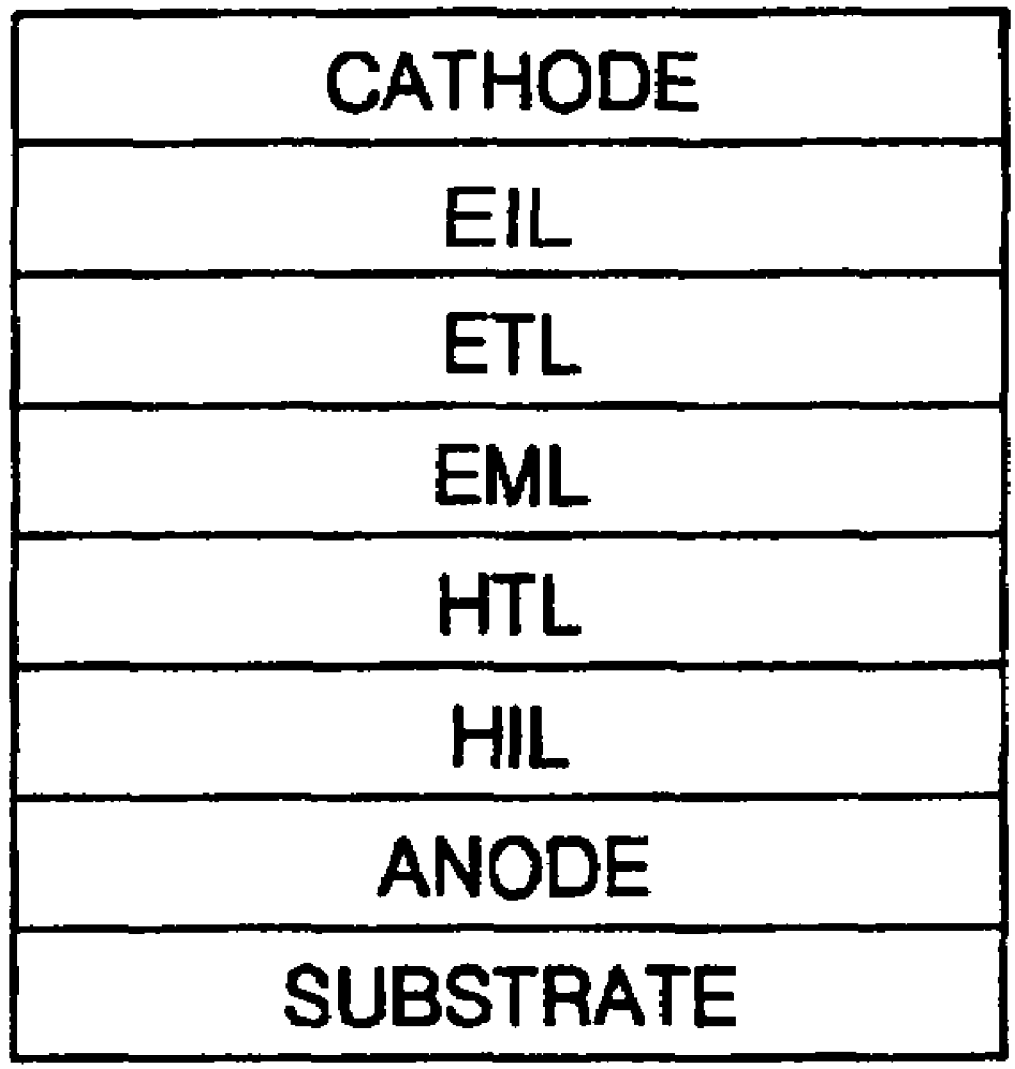
FIG. 1 is a sectional view of an organic light emitting device according to an embodiment of the present invention.

The emission layer according to embodiments of the present invention are made of a phosphorescent dopant and at least two electron transport materials used as a host. The use of at least two electron transport materials as a host facilitates the re-combination of holes and electrons, thus increasing luminous efficiency.

The at least two electron transport materials can have different highest occupied molecular orbital (HOMO) and lowest unoccupied molecular orbital (LUMO) energy levels, wherein the HOMO energy level of at least one of the at least two electron transport materials is lower than the HOMO energy level of the phosphorescent dopant, and the LUMO energy level of at least one of the at least two electron transport materials is greater than the LUMO energy level of the phosphorescent dopant.

That is, at least two electron transport materials with different energy levels co-exist such that the lowest unoccupied molecular orbitals (LUMOs) of the respective electron transport materials affect each other. As a result, the host made of the at least two electron transport materials has a LUMO with a wider energy band than a host made of a single electron transport material. Therefore, electrons can be easily transferred to the emission dopant. In addition, the LUMO with the wide energy band allows for easy movement of carriers from an adjacent electron transport layer. Therefore, disruption of carrier injection by an energy barrier, which occurs when two organic layers contact, can be minimized. Further, the use of at least two electron transport materials as a host prevents the respective host materials from crystallizing and causes defects to form traps between energy levels of the host and the dopant so that carriers can easily move. In addition, a carrier density at interfaces between the electron transport layer and the emission layer due to an energy barrier is substantially lower than in a case where a single host is used such that excimers are evenly dispersed. Therefore, luminous efficiency increases and, in some cases, a hole blocking layer is not required for the device. As mentioned above, the use of the mixed host facilitates the effective transfer of energy, thus increasing the luminous efficiency and lifetime of the organic light emitting device.

A first electron transport material is a spirofluorene compound containing a spirofluorene ring. Such a spirofluorene can have various structures. For example, two spirofluorenes can be connected to each other by a linking group, and the linking group can be substituted with triazole, oxadiazole, naphthalene, anthracene, phenyl, or the like. Alternatively, the 9th position of each spirofluorene can be substituted with O, S, Se, N—R, P—R, or the like, or one spirofluorene can be connected to the other spirofluorene by N—R or P—R. In this case, R can be H, can instead be one of C1-20 alkyl group, a C5-20 aryl group containing a C1-20 alkyl group, a C2-20 heteroaryl group, and a C6-20 aryl group containing a C1-20 alkoxy group. The spirofluorene compound can be 2,5-dispirobifluorene-1,3,4-oxadiazole.

A second electron transport material can be one or more of bis(8-hydroxyquinolato)biphenoxy metal, bis(8-hydroxyquinolato)phenoxy metal, bis(2-methyl-8-hydroxyquinolato)biphenoxy metal, bis(2-methyl-8-hydroxyquinolato)phenoxy metal, bis(2-methyl-8-quinolinolato)(para-phenylphenolato) metal, and bis(2-(2-hydroxyphenyl)quinolato) metal. In this case, the metal can be Al, Zn, Be, or Ga.

The weight ratio of the first electron transport material to the second electron transport material can be in the range of 1:9 to 9:1, preferably, in the range of 2:1 to 1:3, and more preferably, 1:3. When the ratio of the first electron transport material to the second electron transport material is less than 1:9, no effect occurs compared to a single host, which is undesirable. When the ratio of the first electron transport material to the second electron transport material is more than that range, luminous efficiency does not increase, which is also undesirable.

The emission layer can include 70 to 99 parts by weight of the host and 1 to 30 parts by weight of the dopant. When the emission layer includes less than 70 parts by weight of the host, triplet extinction occurs, thus decreasing efficiency, which is undesirable. When the emission layer includes more than 99 parts by weight of the host, luminous efficiency and the lifetime of the organic light emitting devices are decreased due to lack of emission material, which is also undesirable.

The phosphorescent dopant used to form an emission layer according to the present embodiment is an emission material. Such an emission material can be, but is not limited thereto to bisthienylpyridine acetylacetonate Iridium, bis(benzothienylpyridine)acetylacetonate Iridium, bis(2-phenylbenzothiazole)acetylacetonate Iridium, bis(1-phenylisoquinoline)Iridium acetylacetonate, tris(1-phenylisoquinoline)iridium, tris (phenylpyridine)iridium, tris(2-biphenylpyridine)iridium, tris(3-biphenyl pyridine)iridium, tris(4-biphenyl pyridine) iridium, $Ir(pq)_2(acac)$ where pq denotes 2-phenylquinoline and acac denotes acetylacetone, or the like.

The host of the emission layer can be a mixture of a spirofluorene compound and BAlq3 with a mixing ratio of 2:1 to 1:3, and preferably, 1:3. The phosphorescent dopant can be $Ir(pq)_2(acac)$ where pq denotes 2-phenylquinoline and acac denotes acetylacetone or tris(2-phenylpyridine)Iridium (Ir $(ppy)_3$). The emission layer can include 5 to 15 parts by weight of the phosphorescent dopant. The use of the mixture of the spirofluorene compound and BAlq results in increases in the luminous efficiency and increases in lifetime and a decrease in the driving voltage of the organic light emitting device.

A method of manufacturing an organic light emitting devices according to an embodiment of the present invention will now be described with reference to FIG. 1. First, an upper surface of the substrate is coated with an anode material to form an anode. The anode is used as a first electrode. The substrate is a substrate used in a conventional organic light emitting device, preferably glass or a glass substrate that is transparent and waterproof, has smooth surface, and can be easily treated. The substrate can instead be a transparent plastic substrate. The anode material can be a high work function metal ($\geqq 4.5$ eV), a transparent and highly conducting metal such as Indium Tin Oxide (ITO), Indium Zinc Oxide (IZO), $SnO_2$, and ZnO, or the like.

Then, organic layers can be formed on the anode by thermal-vacuum evaporation. Alternatively, spin-coating, dip-coating, doctor-blading, inkjet printing, or thermal transferring can be used to form respective organic layers after dissolving materials used to form the organic layers in a solvent. Preferably, the organic layers are formed by thermal vacuum evaporation.

A hole injection layer (HIL) is optionally formed on the anode by one of thermal-vacuum evaporation, spin-coating, dip-coating, doctor-blading, inkjet printing, and thermal transferring, which are suitable for a material used to form the HIL. The HIL can have a thickness of 50 to 1500 Å. When the thickness of the HIL is less than 50 Å, hole injecting characteristics deteriorate, which is undesirable. When the thickness of the HIL is greater than 1500 Å, a driving voltage of the organic light emitting device increases, which is also undesirable.

The hole injection layer can be made of copper phthalocyanine (CuPc), a starburst-type amine such as TCTA, m-MTDATA, IDE406 (available from Idemitsu Co.), or the like. However, the hole injection layer can instead be made of other materials.

After the HIL is formed, a hole transport layer (HTL) is optionally formed on the HIL by one of thermal-vacuum evaporation, spin-coating, dip-coating, doctor-blading, inkjet printing, and thermal transferring. The material forming the HTL can be, but is not limited to, N,N'-bis(3-methylphenyl)-N,N'-diphenyl-[1,1-biphenyl]-4,4'-diamine(TPD), N,N'-di (naphtalene-1-yl)-N,N'-diphenyl benxidine, N,N'-di(naphtalene-1-yl)-N,N'-diphenyl-benxidine (NPD), IDE320 (obtained from Idemitsu Co.), N,N'-diphenyl-N,N'-bis(1-naphtyl)-(1,1'-biphenyl)-4,4'-diamine (NPB), or the like. The thickness of the HTL can be in the range of 50 to 1500 Å. When the thickness of the HTL is less than 50 Å, hole transporting characteristics deteriorate, which is undesirable. When the thickness of the HTL is greater than 1500 Å, the driving voltage of the organic light emitting device increases, which is also undesirable.

After the HTL is formed, an emission layer (EML) made of at least two electron transport materials and a phosphorescent dopant is formed on the HTL. The EML can be formed by one of thermal evaporation, inkjet printing, and laser transferring, or photolithography. However, the EML can instead be formed using other methods.

The thickness of the EML can be in the range of 100 to 800 Å, and preferably, 300 to 400 Å. When the thickness of the EML is less than 100 Å, the efficiency and lifetime of the organic light emitting device decrease, which is undesirable. When the thickness of the EML is greater than 800 Å, the driving voltage of the organic light emitting device increases, which is also undesirable.

When the phosphorescent dopant is used to form the emission layer, a hole blocking layer (HBL)(not shown) can be optionally formed by vacuum-evaporation or spin-coating a hole blocking material on the EML.

Then, an electron transport layer (ETL) is formed by vacuum-evaporation or by spin-coating an electron transport material on the EML, or by spin-coating the EML with the electron transport material. The electron transport material can be $Alq_3$, but is not limited thereto. The thickness of the electron transport layer can be in the range of 50 Å to 600 Å When the thickness of the ETL is less than 50 Å, the lifetime of the organic light emitting device decreases, which is undesirable. When the thickness of the ETL is more than 600 Å, the driving voltage increases, which is also undesirable.

An electron injection layer (EIL) can be optionally formed on the ETL. The EIL can be made of LiF, NaCl, CsF, $Li_2O$, BaO, Liq, or the like. The thickness of the EIL can be in the range of 1 to 100 Å. When the thickness of the EIL is less than 1 Å, an electron injecting ability decreases, thus increasing the driving voltage of the organic light emitting device, which is undesirable. When the thickness of the EIL is greater than 100 Å, the EIL acts as an insulator, thus increasing the driving voltage of the organic light emitting device, which is also undesirable.

Subsequently, a cathode metal is thermal-vacuum evaporated or sputtered on the EIL to form a cathode, which is a second electrode. The cathode metal can be Li, Mg, Al, Al—Li, Ca, Mg—In, Mg—Ag, or the like. As a result, the organic light emitting device is completed.

The organic light emitting device according to the present invention includes an anode, a HIL, a HTL, an EML, an ETL, an EIL, a cathode, and when needed, one or two intermediate layers. In addition, the organic light emitting device can further include an electron blocking layer.

The present invention will now be described in further detail with reference to the following examples. The following examples are for illustrative purposes and are not intended to limit the scope of the present invention.

Example 1

First, a Corning glass substrate at 15 $\Omega/cm^2$ coated with 1200 Å ITO anode material was cut to a size 50 mm×50 mm×0.7 mm. The resultant glass substrate was cleaned using ultrasonic waves in isopropyl alcohol for 5 minutes, cleaned using ultrasonic waves in pure water for 5 minutes, and cleaned using UV and ozone for 30 minutes. N,N'-di(1-naphtyl)-N,N'-diphenylbenxidine(NPD) was vacuum-evaporated on the substrate to form a hole transport layer to a thickness of about 600 Å.

22 parts by weight of 2,5-dispirobifluorene-1,3,4-oxadiazole, 66 parts by weight of BAlq, and 12 parts by weight of $Ir(pq)_2(acac)$ were co-deposited on the hole transport layer to form an emission layer to a thickness of about 400 Å. $Alq_3$ as an electron transport material was deposited on the emission layer to form an electron transport layer to a thickness of about 300 Å.

LiF was vacuum-evaporated on the electron transport layer to form an electron injection layer to a thickness of about 10 Å and Al was deposited on the electron injection layer to form a cathode to a thickness of about 1000 Å, thereby forming a LiF/Al electrode. As a result, the organic light emitting device illustrated in FIG. 1 was manufactured.

Example 2

An organic light emitting device was manufactured in the same manner as in Example 1, except 66 parts by weight of 2,5-dispirobifluorene-1,3,4-oxadiazole and 22 parts by weight of BAlq were used.

Comparative Example 1

First, a Corning glass substrate at 15 $\Omega/cm^2$ coated with 1200 Å ITO anode material was cut to a size 50 mm×50 mm×0.7 mm. The resultant glass substrate was cleaned using ultrasonic waves in isopropyl alcohol for 5 minutes, cleaned using ultrasonic waves in pure water for 5 minutes, and cleaned using UV and ozone for 30 minutes.

NPD was vacuum-evaporated on the substrate to form a hole transport layer to a thickness of 600 Å. Then, 90 parts by weight of 4,4'-biscarbazolylbiphenyl (CBP) that is used as a host, and 10 parts by weight of $Ir(pq)_2(acac)$ used as a phosphorescent dopant were co-deposited on the hole transport layer to form an emission layer to a thickness of about 400 Å.

Alq3 as an electron transport material was deposited on the emission layer to form an electron transport layer to a thickness of about 300 Å. LiF was vacuum-evaporated on the electron transport layer to form an electron injection layer to a thickness of about 10 Å and Al was deposited on the electron injection layer to form a cathode to a thickness of about 1000 Å, thereby forming a LiF/Al electrode. As a result, the organic light emitting device illustrated in FIG. 1 was manufactured.

Figure 2:
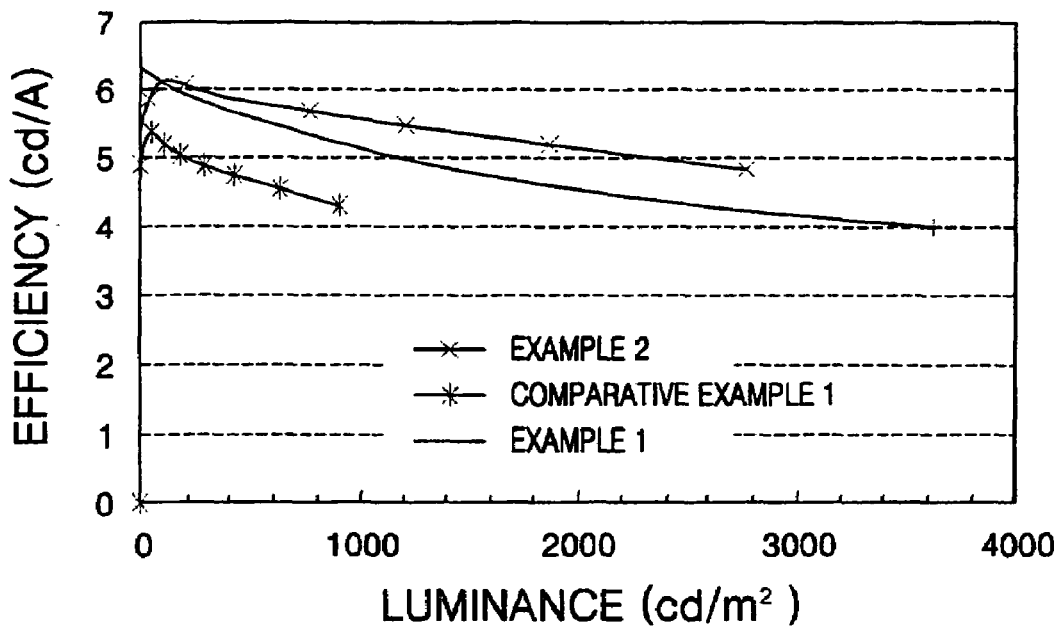
FIG. 2 is a graph of luminance with respect to efficiency of organic light emitting devices according to Examples 1 and 2 and Comparative Example 1.
Figure 3:
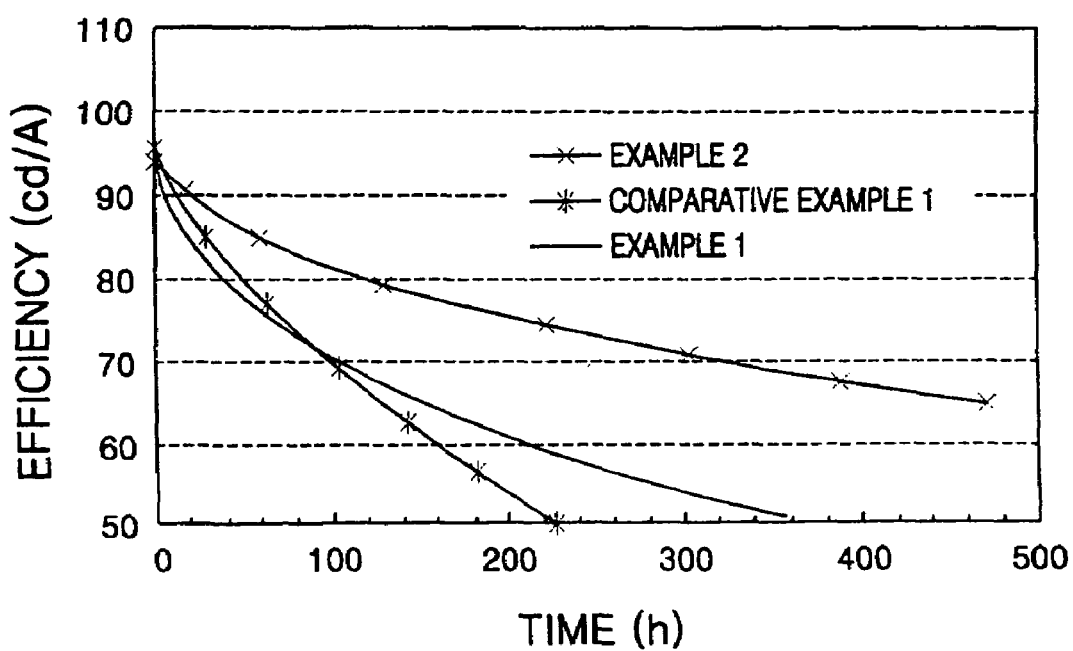
FIG. 3 is a graph of lifetime with respect to luminance of organic light emitting devices according to Examples 1 and 2 and Comparative Example 1.

The luminous efficiency and lifetime of the organic light emitting devices according to Examples 1 and 2 and Comparative Examples 1 were measured, and the results are shown in FIGS. 2 and 3, respectively. The luminous efficiency is given by the luminance per ampere (cd/A) at 800 cd, and the lifetime represents a time taken for an initial luminance of 4000 cd to be reduced to 2000 cd.

Referring to FIG. 2, the organic light emitting devices according to Examples 1 and 2 have better luminous efficiency than the organic light emitting device according to the Comparative Example 1.

Referring to FIG. 3, the organic light emitting devices according to Examples 1 and 2 have longer lifetimes characteristics than the organic light emitting device according to the Comparative Example 1.

An organic light emitting device according to the present invention includes an emission layer made of at least two electron transport materials used as a host, and a phosphorescent dopant. The use of the at least two electron transport materials as a host facilitates the re-combination of holes and electrons in neighboring organic layers, thus improving luminous efficiency, and lengthening the lifetime characteristics of the device. Further, such improvements in the luminous efficiency and lifetime can be seen in an organic light emitting device not including a hole blocking layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting device, comprising:
   a first electrode;
   a second electrode; and
   an emission layer arranged between the first electrode and the second electrode, the emission layer comprising at least two electron transport materials adapted to serve as a host and a phosphorescent dopant, wherein the at least two electron transport materials have different highest occupied molecular orbital (HOMO) and lowest unoccupied molecular orbital (LUMO) energy levels, wherein a HOMO energy level of at least one of the at least two electron transport materials is lower than a HOMO energy level of the phosphorescent dopant, and a LUMO energy level of at least one of the at least two electron transport materials is greater than a LUMO energy level of the phosphorescent dopant.

2. An organic light emitting device, comprising:
   a first electrode;
   a second electrode; and
   an emission layer arranged between the first electrode and the second electrode, the emission layer comprising at least two electron transport materials adapted to serve as a host and a phosphorescent dopant, wherein one of the at least two electron transport materials comprises 2,5-dispirofluorene-1,3,4-oxadiazole spirofluorene compound.

3. The organic light emitting device of claim 1, wherein one of the at least two electron transport materials comprises at least a metal-organic complex.

4. The organic light emitting device of claim 3, wherein the metal-organic complex comprises at least a compound selected from the group consisting of BAlq, bis(8-hydroxyquinolato)biphenoxy metal, bis(8-hydroxyquinolato)phenoxy metal, bis(2-methyl-8-hydroxyquinolato)biphenoxy metal, bis(2-methyl-8-hydroxyquinolato)phenoxy metal, bis(2-methyl-8-quinolinolato)(para-phenyl-phenolato) metal, and bis(2-(2-hydroxyphenyl)quinolato) metal.

5. The organic light emitting device of claim 1, wherein the emission layer is comprised of 70 to 99 parts by weight of the host and 1 to 30 parts by weight of the phosphorescent dopant based on 100 parts by weight of materials forming the emission layer.

6. The organic light emitting device of claim 1, wherein a weight ratio of one of the at least two electron transport materials to another of the at least two electron transport materials is in the range of 1:9 to 9:1.

7. The organic light emitting device of claim 1, wherein the phosphorescent dopant is comprised of a compound selected from the group consisting of bisthienylpyridine acetylacetonate Iridium, bis(benzothienylpyridine)acetylacetonate Iridium, bis(2-phenylbenzothiazole)acetylacetonate Iridium, bis(1-phenylisoquinoline)Iridium acetylacetonate, tris(1-phenylisoquinoline) iridium, tris(phenylpyridine) iridium, tris(2-biphenylpyridine)iridium, tris(3-biphenyl pyridine)iridium, tris(4-biphenyl pyridine)iridium, and Ir(pq)$_2$(acac) where pq denotes 2-phenylquinoline and acac denotes acetylacetone.

8. The organic light emitting device of claim 1, further comprising at least one layer arranged between the first electrode and the emission layer, the at least one layer comprising a layer selected from the group consisting of a hole injection layer and a hole transport layer.

9. The organic light emitting device of claim 1, further comprising at least one layer arranged between the emission layer and the second electrode, the at least one layer comprising a layer selected from the group consisting of a hole blocking layer, an electron transport layer, and an electron injection layer.

10. The organic light emitting device of claim 1, wherein the emission layer is comprised of a spirofluorene compound, an aluminum complex and a phosphorescent dopant.

11. The organic light emitting device of claim 10, wherein the spirofluorene compound comprises 2,5-dispirobifluorene-1,3,4-oxadiazole, and the aluminum complex comprises BAlq.

12. The organic light emitting device of claim 10, wherein and an amount of the phosphorescent dopant is in the range of 5 to 15 parts by weight based on 100 parts by weight of materials forming the emission layer, the phosphorescent dopant comprises Ir(pq)$_2$(acac) where pq denotes 2-phenylquinoline and acac denotes acetylacetone.

13. The organic light emitting device of claim 10, wherein a weight ratio of the spirofluorene compound to the aluminum complex is in the range of 1:2 to 1:4.

14. The organic light emitting device of claim 1, the at least two electron transport materials being different from each other.

15. A method of making an organic light emitting device, comprising:
providing a transparent glass substrate;
forming an anode on the transparent glass substrate by applying a thin transparent conductive layer on the glass substrate;
forming a hole injection layer on the anode;
forming a hole transport layer on the hole injection layer;
forming an emission layer on the hole transport layer, the emission layer comprising at least a first electron transport material, a second and different electron transport material and a phosphorescent dopant, wherein the first electron transport material comprises 2,5-dispirofluorene-1,3,4-oxadiazole;
forming an electron transport layer on the emission layer;
forming an electron injection layer on the electron transport layer; and
forming a cathode on the electron injection layer.

16. The method of claim 15, the emission layer being formed by a process selected from the group consisting of thermal evaporation, inkjet printing, and laser transferring and photolithography.

17. The method of claim 16, the second electron transport material comprising at least one material selected from the group consisting of bis(8-hydroxyquinolato)biphenoxy metal, bis(8-hydroxyquinolato)phenoxy metal, bis(2-methyl-8-hydroxyquinolato)biphenoxy metal, bis(2-methyl-8-hydroxyquinolato)phenoxy metal, bis(2-methyl-8-quinolinolato)(para-phenyl-phenolato) metal, and bis(2-(2-hydroxyphenyl)quinolato) metal where the metal is an element selected from the group consisting of Al, Zn, Be and Ga.

18. The method of claim 17, the phosphorescent dopant being an emission material selected from the group consisting of bisthienylpyridine acetylacetonate Iridium, bis(benzothienylpyridine)acetylacetonate Iridium, bis(2-phenylbenzothiazole)acetylacetonate Iridium, bis(1-phenylisoquinoline)Iridium acetylacetonate, tris(1-phenylisoquinoline)iridium, tris(phenylpyridine)iridium, tris(2-biphenylpyridine)iridium, tris(3-biphenyl pyridine)iridium, tris(4-biphenyl pyridine)iridium and Ir(pq)$_2$(acac) where pq denotes 2-phenylquinoline and acac denotes acetylacetone.

19. The method of claim 15, wherein the two electron transport materials have different highest occupied molecular orbital (HOMO) and lowest unoccupied molecular orbital (LUMO) energy levels, wherein a HOMO energy level of at least one of the at least two electron transport materials is lower than a HOMO energy level of the phosphorescent dopant, and a LUMO energy level of at least one of the at least two electron transport materials is greater than a LUMO energy level of the phosphorescent dopant.

* * * * *